US009078340B2

(12) United States Patent  
Cagliani et al.

(10) Patent No.: US 9,078,340 B2  
(45) Date of Patent: Jul. 7, 2015

(54) CABINET FOR AN ELECTRICAL SWITCHBOARD AND RELATED SWITCHBOARD

(71) Applicant: ABB S.p.A., Milan (IT)

(72) Inventors: Daniele Cagliani, Molteno (IT); Graziano Coloca, Calolziocorte (IT); Pierceleste Benedetti, Orsenigo (IT)

(73) Assignee: ABB S.P.A., Milan (IT)

( * ) Notice: Subject to any disclaimer, the term of this patent is extended or adjusted under 35 U.S.C. 154(b) by 184 days.

(21) Appl. No.: 13/892,619

(22) Filed: May 13, 2013

(65) Prior Publication Data

US 2013/0320822 A1 Dec. 5, 2013

(30) Foreign Application Priority Data

May 30, 2012 (EP) .................................... 12170036

(51) Int. Cl.
*H02G 3/08* (2006.01)
*H05K 5/00* (2006.01)
*H02B 1/30* (2006.01)

(52) U.S. Cl.
CPC .............. *H05K 5/0004* (2013.01); *H02B 1/303* (2013.01)

(58) Field of Classification Search
USPC ........................ 174/50; 211/26, 182; 361/829; 312/223.1
See application file for complete search history.

(56) References Cited

U.S. PATENT DOCUMENTS

| 5,890,607 | A | * | 4/1999 | Maglione | ...................... 211/189 |
| 6,401,940 | B1 | * | 6/2002 | Hartel et al. | ..................... 211/26 |
| 7,498,512 | B2 | * | 3/2009 | Adducci et al. | .................. 174/50 |

FOREIGN PATENT DOCUMENTS

| DE | 103 36 181 A1 | 5/2005 |
| FR | 2 937 113 A1 | 4/2010 |

OTHER PUBLICATIONS

Search Report issued on Aug. 8, 2012, by the European Patent Office for Application No. 12170036.3.

* cited by examiner

*Primary Examiner* — Dhirubhai R Patel
(74) *Attorney, Agent, or Firm* — Buchanan Ingersoll & Rooney PC

(57) ABSTRACT

A cabinet for an electrical switchboard includes a supporting base and a frame mounted on the supporting base. The supporting base includes a base element having a lower wall configured to rest on a bearing surface, and a first lateral wall and a second lateral wall which protrude transversally from the lower wall and face each other. The base element includes a first upper wall protruding from an upper end of the first lateral wall towards the second lateral wall, a second upper wall protruding from an upper end of the second lateral wall towards the first lateral wall, so as to extend over at least a portion of the first upper wall. The base element also includes a coupling mechanism which couples the first and second upper walls to each other for supporting a corresponding portion of the frame.

15 Claims, 5 Drawing Sheets

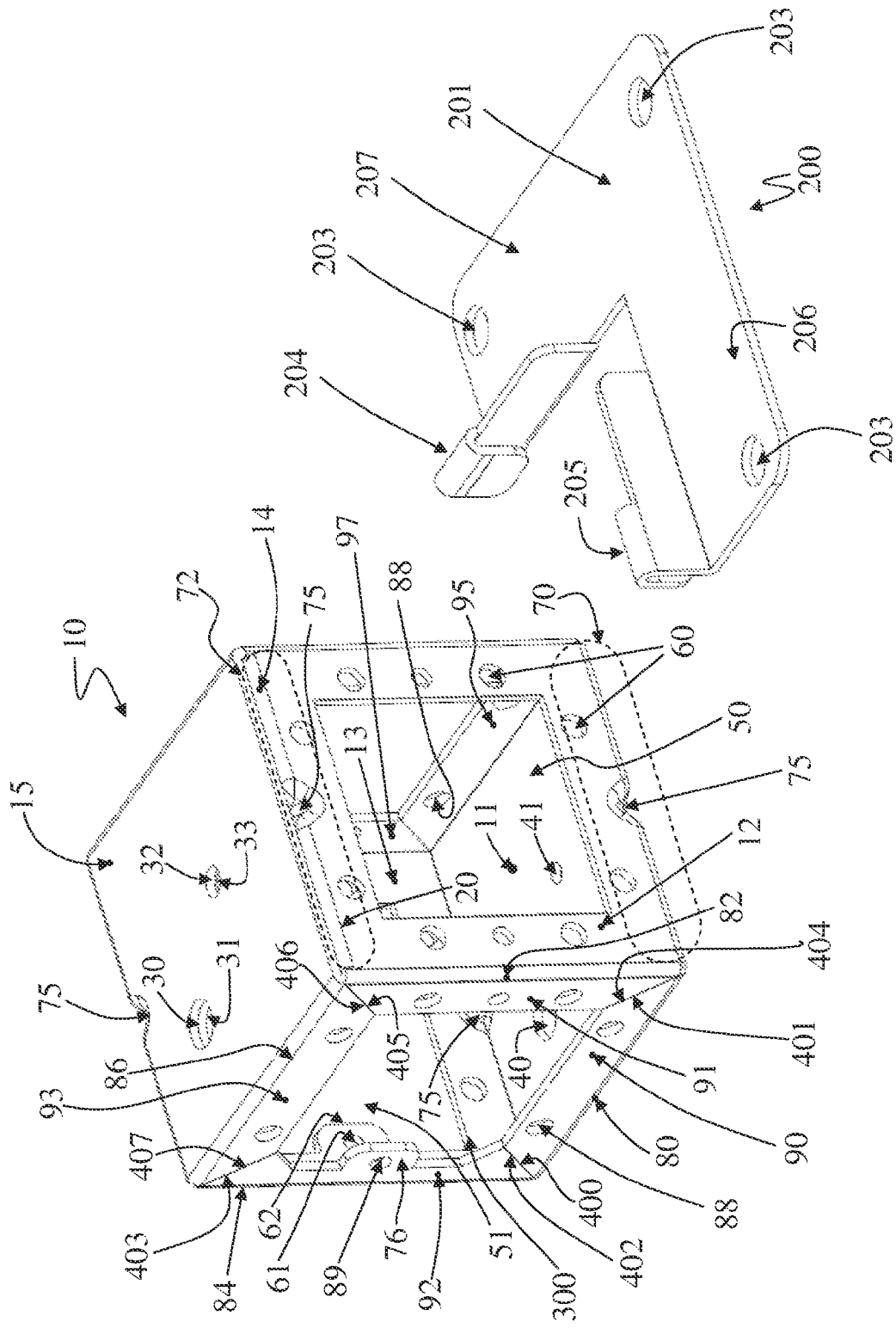

CABINET FOR AN ELECTRICAL SWITCHBOARD AND RELATED SWITCHBOARD

RELATED APPLICATION

This application claims priority under 35 U.S.C. §119 to European Patent Application No. 12170036.3 filed in Europe on May 30, 2012, the entire content of which is hereby incorporated by reference in its entirety.

FIELD

The present disclosure relates to a cabinet for an electrical switchboard having a frame and an improved supporting base for mounting the frame itself on a bearing surface.

BACKGROUND INFORMATION

A known cabinet for an electrical switchboard includes a frame defined by coupling a plurality of frame members. The frame defines a space suitable for housing one or more electrical components of an electrical switchboard therein.

For example, cabinets for low voltage electrical switchboards house, inter alia, circuit breakers, bus bars, control buttons, cable conduits, and supporting guides.

The frame furthermore constitutes a structural skeleton to which the elements for supporting the above-mentioned electrical components, the cladding panels, the top, the base, the door of the cabinet, etc., are operatively connected.

The cabinet is arranged so that the lower part of its frame rests on a supporting base and is fixed thereto. In turn, the supporting base is fixed to a bearing surface, such as the floor of the room housing the cabinet. In addition to supporting and fixing the frame, the supporting base defines a lower compartment for the accommodation and passage of wiring cables for the electrical components placed into the frame itself.

Generally, the supporting base includes four corner elements, each one suitable for being operatively connected to a corresponding lower corner portion of the frame. The base corner element includes an upper wall to which the corresponding corner portion of the frame is fixed, a lower wall which is fixed to the floor, and lateral walls connecting the lower and upper walls, so as to distribute the weight exerted by the cabinet to the lower wall and, therefore, to the floor.

For example, base corner elements according to a known solution include three lateral walls, defining three of the lateral faces of the corner element itself, while the remaining lateral face is used as an access to the upper and lower walls.

Generally, the base corner element is manufactured monolithically, by cutting and folding a metal plate so as to define a structure including the upper wall, the lower wall, and the lateral walls.

The upper, lower and lateral walls are mutually connected so that the structure of the base corner element is kept rigidly assembled mainly by the weight of the frame of the cabinet (and the components associated with or housed into such frame).

For example, one of the lateral walls could be displaced with respect to its position for supporting the upper wall, due, for example, to an external applied force. Such displacement would cause a deformation of the upper wall subjected to the above-mentioned weight, and therefore a decreasing of the overall sturdiness of the base element.

Therefore, in view of the current state of the art, although known solutions perform in a rather satisfying way, there is still reason and desire for further improvements.

SUMMARY

An exemplary embodiment of the present disclosure provides a cabinet for an electrical switchboard. The exemplary cabinet includes a supporting base, and a frame mounted on the supporting base. The supporting base includes a base element, which includes a lower wall configured to rest on a bearing surface, a first lateral wall and a second lateral wall which protrude transversally from the lower wall and face each other, a first upper wall protruding from an upper end of the first lateral wall towards the second lateral wall, a second upper wall protruding from an upper end of the second lateral wall towards the first lateral wall, so as to extend over a portion of the first upper wall, and coupling means which couple the first and second upper walls to each other for supporting a corresponding portion of the frame.

BRIEF DESCRIPTION OF THE DISCLOSURE

Additional refinements, advantages and features of the present disclosure are described in more detail below with reference to exemplary embodiments illustrated in the drawings, in which:

FIG. 5 shows a first perspective view of a base element suitable to be used in a cabinet according to an exemplary embodiment of the present disclosure;

FIG. 6 shows a shaped body suitable to be associated with a base element according to an exemplary embodiment of the present disclosure;

Figure 1:
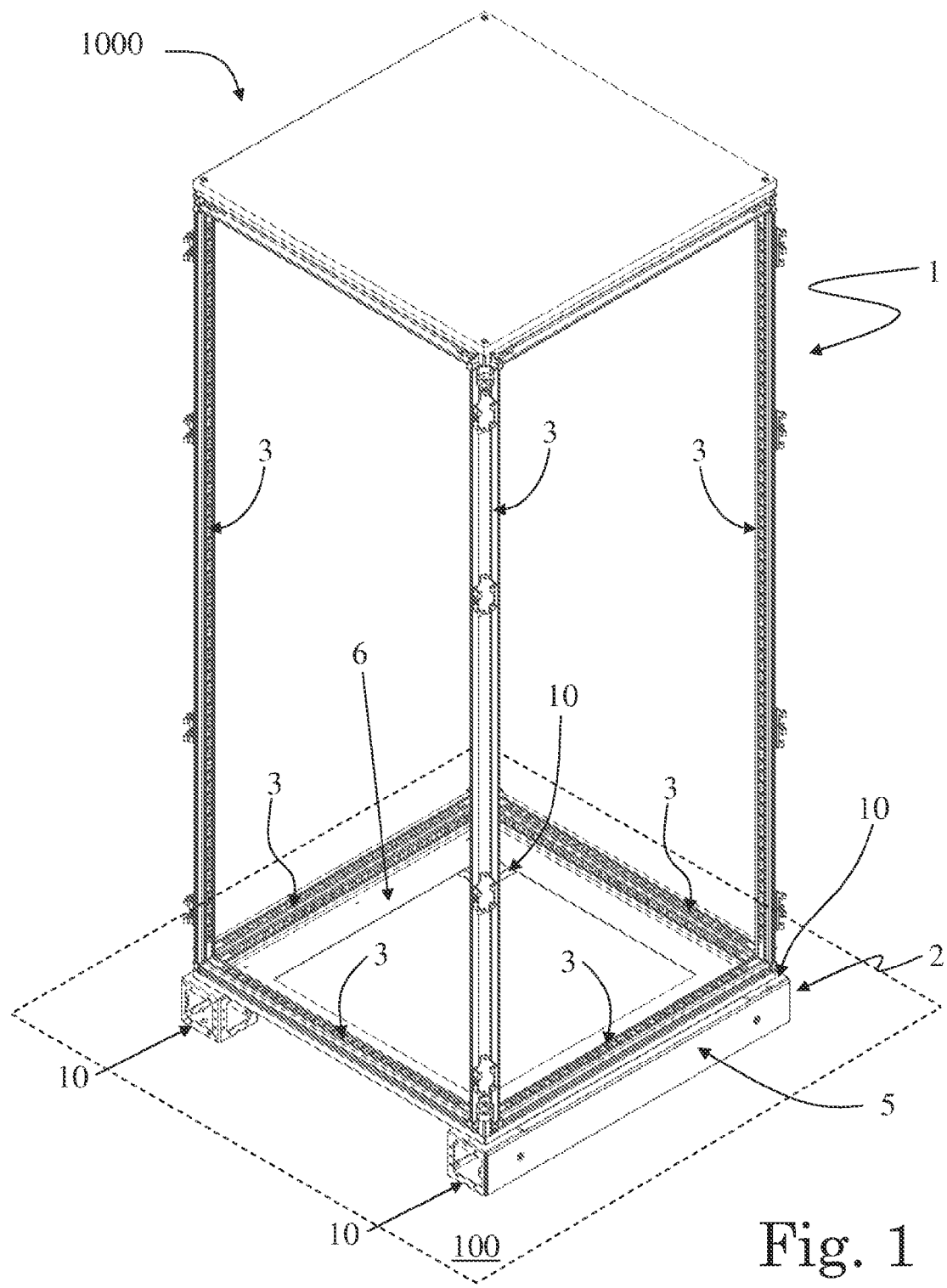
FIG. 1 is perspective view of a frame of a cabinet, which is mounted on a supporting base according to an exemplary embodiment of the present disclosure.

It should be noted that in the detailed description that follows, identical or similar components, either from a structural and/or functional point of view, have the same reference numerals, regardless of whether they are shown in different exemplary embodiments. It should also be noted that in order to clearly and concisely describe exemplary embodiments of the present disclosure, the drawings may not necessarily be to scale and certain features of the present disclosure may be shown in somewhat schematic form.

DETAILED DESCRIPTION

Exemplary embodiments of the present disclosure provide an improved cabinet for an electrical switchboard having a frame and an improved supporting base for mounting the frame itself on a bearing surface. For example, an exemplary embodiment of the present disclosure provides a cabinet for an electrical switchboard including a supporting base and a frame mounted on the supporting base. The supporting base includes at least a base element having a lower wall configured to rest on a bearing surface, and a first lateral wall and a second lateral wall which protrude transversally from the lower wall and face each other.

The base element includes a first upper wall protruding from an upper end of the first lateral wall towards the second lateral wall, a second upper wall protruding from an upper end of the second lateral wall towards the first lateral wall, so as to extend over at least a portion of the first upper wall, and coupling means which couple the first and second upper walls to each other for supporting a corresponding portion of the frame.

Another exemplary embodiment of the present disclosure provides an electrical switchboard including a cabinet as described herein.

Further characteristics and advantages will be more apparent from the following description of exemplary, but non-exclusive, embodiments of a cabinet for an electrical switchboard and the associated base element according to the present disclosure, illustrated only for non-limitative exemplary purposes in the accompanying drawings.

With reference to the drawings, the present disclosure provides a cabinet 1000 for an electrical switchboard. The cabinet 1000 has a frame and a supporting base which are indicated by reference numerals 1 and 2, respectively, in the illustrated exemplary embodiment of FIG. 1.

The frame 1 defines an internal space suitable for housing one or more electrical components of the electrical switchboard and furthermore constitutes a structural skeleton to which the elements for supporting such electrical components, the cladding panels, the top, the base, the door of the cabinet 1000, etc. can be operatively connected.

According to the exemplary embodiment of FIG. 1, the frame 1 includes, for example, a plurality of profiled members 3 which are mutually connected so as to realize a substantially parallelepipedal shape. For example, the frame 1 includes a plurality of corner joint elements 4, each one mutually joining three frame members 3 so as to define a corner portion of the frame 1.

This solution for realizing the frame 1 is well known in the art and therefore not further disclosed hereinafter.

Figure 7:
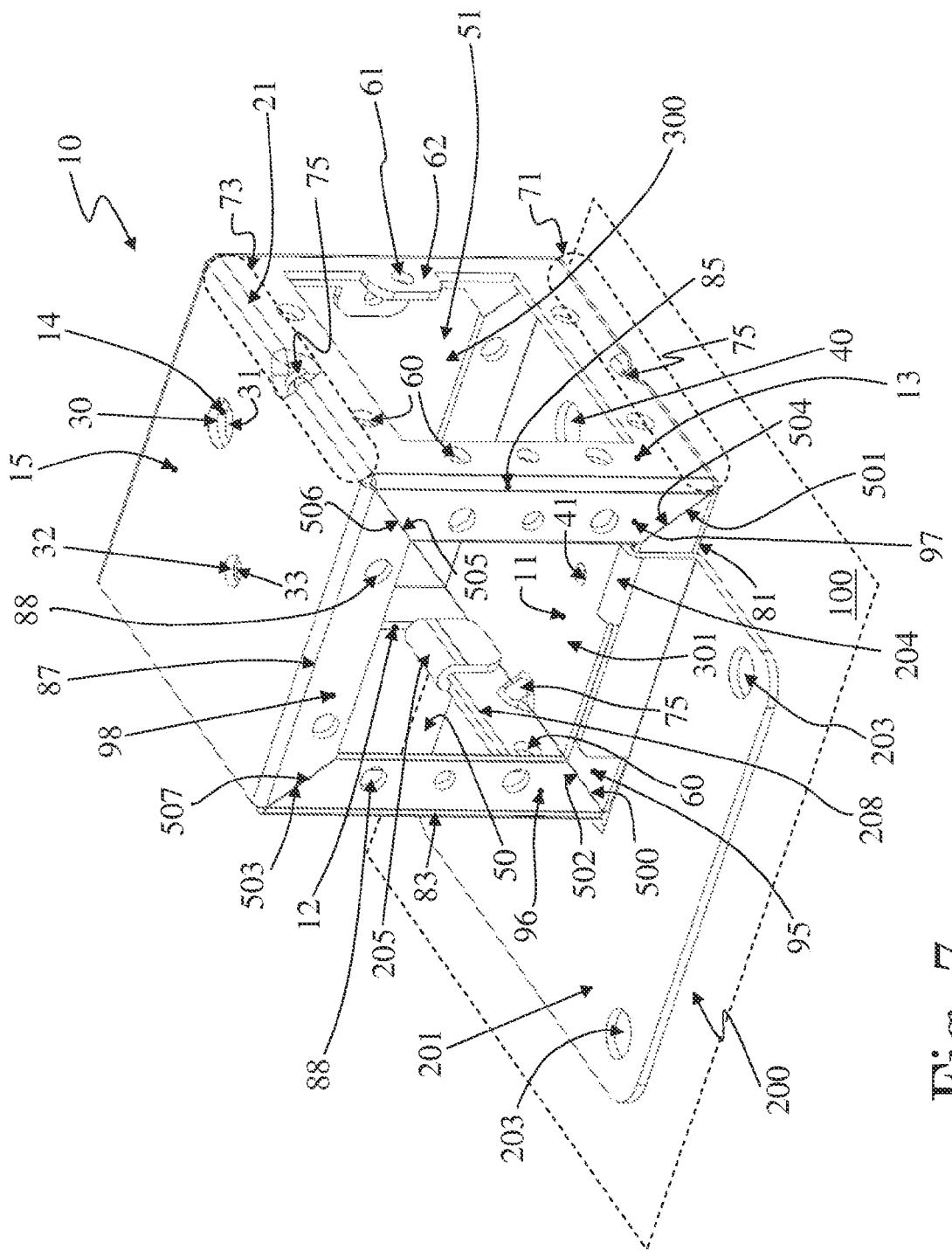
FIG. 7 shows a second perspective view of the base element of FIG. 5, with associated thereto the shaped body of FIG. 6.

The frame 1 is mounted on the supporting base 2 which is suitable (e.g., configured) for supporting the frame 1 itself and positioning it on a support, or bearing, surface (schematically illustrated by dot lines and indicated with reference numeral 100 in FIGS. 1 and 7), such as, for example, the floor 100 of a room housing the cabinet 1000.

According to the exemplary embodiment of FIGS. 1-7, the supporting base 2 of the cabinet 1000 includes a base element 10 having a lower wall 11 which is configured to rest on the bearing surface 100, a lateral wall 12 and a lateral wall 13 which protrude transversally from the lower wall 11 and face each other, an upper wall 14 protruding from an upper end 20 of the lateral wall 12 towards the lateral wall 13, and an upper wall 15 protruding from an upper end 21 of the lateral wall 13 towards the lateral wall 12, so as to extend over at least a portion of the upper wall 14.

According to the exemplary embodiment of FIGS. 5 and 7, the base element 10 includes: a lower corner portion 70 defined by the lower wall 11 and the lateral wall 12; a lower corner portion 71 defined by the lower wall 11 and the lateral wall 13; an upper corner portion 72 defined by the lateral wall 12 and the upper wall 14; and an upper corner portion 73 defined by the lateral wall 13 and the upper wall 15.

The base element 10 according to the present disclosure also includes coupling means 30, 31, 32, 33, 34 (examples of which are described below) which couple the upper walls 14 and 15 to each other for supporting a corresponding portion of the frame 1. For example, the coupling means are configured to avoid a relative movement between the upper walls 14, 15.

In the exemplary embodiment of FIG. 1, the supporting base 2 includes four base elements 10, each one placed at a corresponding lower corner portion of the frame 1.

For example, the lower wall 11 of each base element 10 rests on the bearing surface 100, while the coupled upper walls 14 and 15 support the corresponding lower corner portion of the frame 1.

According to an exemplary embodiment, the lower corner portion of the frame 1 is fixed to at least one of the coupled upper and lower walls 14 and 15 of the corresponding base element 10.

According to an exemplary embodiment, the four base elements 10 illustrated in FIG. 1 could be mutually connected by pairs through connecting elements such as, for instance, metal panels, cross-pieces or covering plates (only one of which is illustrated for example and indicated with reference numeral 5 in FIG. 1).

It is to be set forth that according to the applications or the dimensioning of the frame 1, the position of the base elements 10 with respect to the supported frame 1, or the number thereof, can be different to the one illustrated for exemplary purposes in FIG. 1. For example, in addition to the four base elements 10 illustrated in FIG. 1, other base elements 10 could be provided placed between two base corner elements 10, so as to support a corresponding lower portion of the frame 1 comprised between two lower corner portions.

According to an exemplary but not limiting embodiment, the upper wall 15 of the base element 10 protrudes from the upper end 21 of the lateral wall 13 so as to overlap and rest on at least a portion of the upper wall 14.

In the exemplary embodiment of FIGS. 5 and 7, the upper wall 14 extends from the upper end 20 of the lateral wall 12 to the lateral wall 13 (as will be more apparent in a part of the following description which is related to the manufacturing process of the base element 10). The upper wall 15 extends from the upper end 21 of the lateral wall 13 to the lateral wall 12, so as to overlap and rest on the overall upper wall 14.

According to an exemplary but not limiting embodiment, the coupling means which mutually couple the upper walls 14 and 15 of the base element 10 include a first through hole 31, 33 defined in the upper wall 14, and a corresponding second through hole 30, 32 defined in the upper wall 15 (e.g., in the portion of the wall 15 extending over the wall 14).

The first through hole 31, 33 and the second through hole 30, 32 are defined in the respective upper walls 14, 15 so that the second through hole 30, 32 is placed over and aligned to the corresponding first through hole 31, 33.

The coupling means can also include a fixing screw operatively coupled to the aligned first and second through holes 31-30, 33-32, so as to mutually fix the upper walls 14, 15.

According to the exemplary embodiments of FIGS. 1-7, at least one of the upper walls 14 and 15 includes means for coupling the supported portion of the frame 1 to the base element 10. According to an exemplary embodiment, the fixing screw inserted into the first and second through holes 30-31, 32-33 for mutually fixing the upper walls 14, 15 is also operatively coupled to the portion of the frame 1 supported by such coupled upper walls 14, 15.

In the exemplary embodiment of FIGS. 2-7, two through holes 30 and 32 are defined in the upper wall 15 so as to be placed over and aligned to a through hole 31 and a through hole 33, respectively, defined in the upper wall 14. A fixing screw 34 is coupled to the aligned through holes 30 and 31, and an additional fixing screw is coupled to the aligned through holes 32 and 33.

Figure 2:
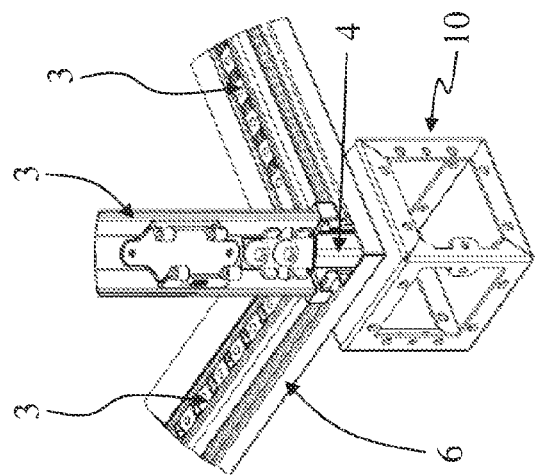
FIG. 2 shows a corner portion of the frame of FIG. 1 fixed to a respective base element according to an exemplary embodiment of the present disclosure.
Figure 3:
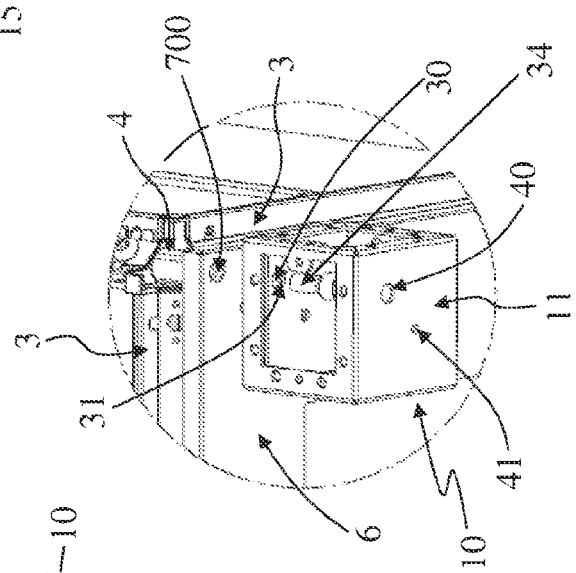
FIGS. 3 and 4 show, form different views, the base element of FIG. 2 in phase of assembly with the respective corner portion of the frame.
Figure 4:
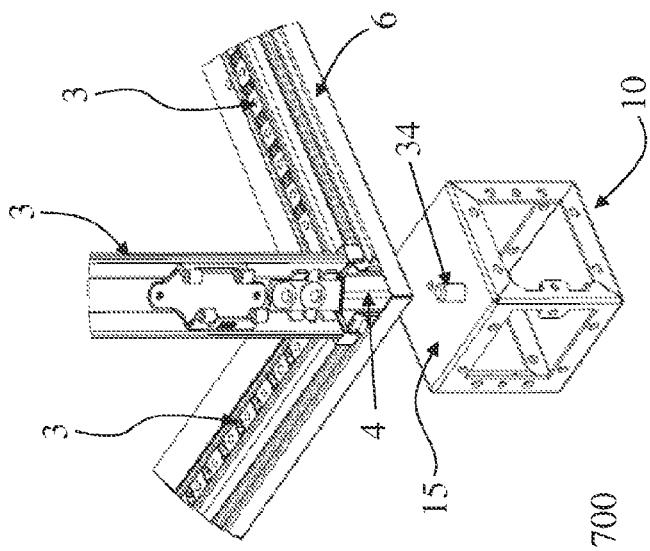

With reference to FIGS. 2-4, the fixing screw 34 passes through and exits from the aligned though holes 30 and 31, so as to operatively couple also with the lower corner portion of the frame 1 supported by the upper walls 14, 15. For example, the fixing screw 34 is inserted into a corresponding hole 700 of the corner joint element 4 of such lower corner portion of the frame 1.

The fixing screw coupled to the through holes 32-33 is also operatively coupled to a plate 6 connected to the lower portion of the frame 1, as per the illustrated example of FIG. 1. By having at least two fixing points between the base element 10 and the frame 1, a relative rotational movement between the base element 10 and the frame 1 is avoided.

It is to be understood that the number of pairs of aligned through holes in the upper walls 14, 15 could be different to the one illustrated for example in FIGS. 2-7. For instance, additional through holes 36 and 35 could be defined in the upper wall 14 and in the upper wall 15 (FIG. 8), so as to define a third pair of aligned through holes 35, 36 for the insertion of a fixing screw.

Such third pair of through holes 35, 36 is placed near to the pair of through holes 30, 31 and can be used to fix the base element 10 to a corner portion of a frame 1 having different dimension with respect to the frame 1 fixed to the base element 10 by means of the pair of through holes 30-31.

According to the exemplary embodiment of FIGS. 5 and 7, a window 50, 51 is defined in at least one of the lateral walls 12, 13, so as to provide access for an operator to the internal part of the base element 1 (e.g., at least to the internal surfaces of the lower surface 11 and the upper wall 14), and/or at least one of the lateral walls 12, 13 includes means 60, 61 for fixing one or more components or elements to the base element 10.

In the example illustrated in FIGS. 5 and 7, a window 50 and a window 51 are defined in the lateral wall 12 and in the lateral wall 13, respectively, so as access to the internal part of the base element 10 is provided from at least two sides of the base element 10 itself.

Fixing means 60, for example, holes 60, are defined in the lateral walls 12, 13, placed around the windows 50 and 51; one or more of holes 60 can be used, for example, to fix a connecting element 5 to the base element 10, as illustrated in FIG. 1.

Further, fixing means 61, for example, a hole 61, are defined in a tongue 62 protruding transversally from a lateral edge delimiting the window 51.

The supporting base 2 of the cabinet 1000 can be coupled to other adjacent bases 2, so as to have a series of cabinets 1000 arranged side by side. In this case, two base elements 10 belonging to adjacent bases 2 can be positioned to have the respective tongues 62 overlapped. In this way, a fixing screw can be coupled to the holes 61 of the overlapped tongues 62 to mutually fix the two adjacent base elements 10.

According to an exemplary embodiment, one or more of the corner portions 70, 71, 72 and 73 of the base element 1 include an indent 75. In the exemplary embodiment of FIGS. 5 and 7, each of the corner portions 70-73 includes an indent 75 which is defined substantially at the center of the respective corner portion 70-73.

According to the exemplary embodiment of FIGS. 5 and 7, the lower wall 11 of the base element 10 has two opposed sides 80 and 81, the lateral wall 12 has two opposed sides 82 and 83, the lateral wall 13 has two opposed sides 84 and 85, and the upper wall 15 has two opposite sides 86 and 87. The sides 80, 82, 84, 86 delimit a first lateral face of the base element 10 perpendicular with respect to the lower wall 11 and to the lateral walls 13, 14, and the sides 81, 83, 85, 87 delimit a second lateral face of the base element 10, that is parallel with respect to the first lateral face.

The base element 10 includes a lower tab 90 which protrudes from the side 80 of the lower wall 11 towards the upper wall 15, a lateral tab 91 which protrudes from the side 82 of the lateral wall 12 towards the lateral wall 13, a lateral tab 92 which protrudes from the side 84 of the lateral wall 13 towards the lateral wall 12, an upper tab 93 which protrudes from the side 86 of the upper wall 15 towards the lower wall 11, a lower tab 95 which protrudes from the side 81 of the lower wall 11 towards the upper wall 15, a lateral tab 96 which protrudes from the side 83 of the lateral wall 12 towards the lateral wall 13, a lateral tab 97 which protrudes form the side 85 of the lateral wall 13 towards the lateral wall 12, and an upper tab 98 which protrudes from the side 87 of the upper wall 15 towards the lower wall 11.

The tabs 90-93 are shaped so that, due to weight of the frame 1 (and, when present, the components associated with or housed into the space defined by such frame 1) exerted on the base element 10, the upper tab 93 abuts against the two lateral tabs 91 and 92, which in turn abut against the lower tab 90. In the same way, the tabs 95-98 are shaped so that the upper tab 98 abuts against the two lateral tabs 96 and 97, which in turn abut against the lower tab 95.

In this way, part of the above-mentioned weight is advantageously distributed from the upper wall 15 to the base wall 11 (and therefore to the bearing surface 100) through the connected tabs 90-93 and the connected tabs 95-98.

According to an exemplary but non-limiting embodiment, the tabs 90-93 and the tabs 95-98 are also shaped so as to delimit a first window 300 and a second window 301, respectively, for providing access to the internal part of the base element 10 (e.g., at least to the internal surfaces of the upper wall 14 and the lower wall 11).

In the exemplary embodiment of FIGS. 5 and 7, each of the tabs 90-93 has a couple of opposed oblique sides, respectively indicated with reference numerals 400 and 401 for the lower tab 90, 402 and 403 for the lateral tab 92, 404 and 405 for the lateral tab 91, and 406 and 407 for the upper tab 93.

For example, the oblique sides 406 and 407 of the upper tab 93 abut against the oblique side 405 of the lateral tab 91 and the oblique side 403 of the lateral tab 92, respectively, and the oblique side 402 of the lateral tab 92 and the oblique side 404 of the lateral tab 91 abut against the oblique side 400 and the oblique side 401, respectively, of the lower tab 90.

In the same way, each of the tabs 95-98 has a couple of opposed oblique sides, respectively indicated with reference numeral 500 and 501 for the lower tab 95, 502 and 503 for the lateral tab 96, 504 and 505 for the lateral tab 97, and 506 and 507 for the upper tab 98.

For example, the oblique sides 506 and 507 of the upper tab 98 abut against the oblique side 505 of the lateral tab 97 and the oblique side 503 of the lateral tab 96, respectively, and the oblique side 502 of the lateral tab 96 and the oblique side 504 of the lateral tab 97 abut against the oblique side 500 and the oblique side 501, respectively, of the lower tab 95.

According to an exemplary but non-limiting embodiment, at least one of the tabs 90-93 and/or at least one of the tabs 95-98 includes means 88, 89 for fixing one or more components or elements to the base element 10.

In the exemplary embodiment of FIGS. 5 and 7, such fixing means 88, 89 include holes 88 defined in the tabs 90-93 and in the tabs 95-98, so as to surround the windows 300 and 301 defined by such tabs 90-93 and 95-98, respectively.

The fixing means 88, 89 also include a hole 89 which is defined in a tongue 76 protruding transversally from the lateral tab 92. In this way, two base elements 10 belonging to adjacent supporting bases 2 of side-by-side cabinets 1000 can be positioned to have the respective tongues 76 overlapped. Therefore, a fixing screw can be coupled to the holes 89 of the overlapped tongues 76 to fix the two base elements 10 each other.

According to the exemplary embodiments of FIGS. 5 and 7, the lower wall 11 of the base element 10 includes means 40 for fixing the wall 11 itself to the bearing surface 100. For example, a through hole 40 is defined in the lower wall 11 suitable for receiving a fixing screw. Such fixing screw is coupled to the bearing surface 100. In this way, the base elements 10 of the supporting base 2 (and the supported frame 1) are fixed to the bearing surface 100.

Alternatively or in addition to such solution for fixing the base element 10 to the bearing surface 100, the supporting base 2 can include at least a shaped body 200 such as, for example, a bracket 200, which is operatively associated to a respective base elements 10. For example, with reference to FIGS. 6 and 7, the shaped body 200 includes a substantially flat portion 201 suitable for resting on the bearing surface 100, wherein means 203 are defined in such portion 201 for fixing the shaped body 200 to the bearing surface 100, and at least a connecting portion 204, 205 suitable for being connected to a corresponding portion of the base element 10.

According to an exemplary but non-limiting embodiment, the connecting portion 204, 205 includes a first hooking element 204 and a second hooking element 205 which protrude transversally from the flat portion 201, in such a way that the hooking element 204 can be connected to one of the lower tabs 90 and 95, and the hooking element 205 can be connected to an edge of the window 50 (defined in the lateral wall 12) or to an edge of the window 51 (defined in the lateral wall 13).

In the exemplary embodiment of FIGS. 6 and 7, the flat portion 201 of the shaped body 200 is substantially L-shaped, for example, it includes two arms 206 and 207 which are mutually linked transversally. Three through holes 203 are defined in the flat portion 201 for receiving respective fixing screw to be coupled to the bearing surface 100.

The hooking elements 204 and 205 protrude transversally from the arm 206 and the arm 207, respectively, at the internal corner defined by such arms 206, 207. For example, as illustrated in FIG. 7, the hooking element 204 is hooked to the lower tab 95 of the base element 10, while the hooking element 205 is hooked to an edge 208 delimiting the lower end of the window 50.

An exemplary manufacturing process of a base element 10 according to the present disclosure is described in the following description.

Figure 8:
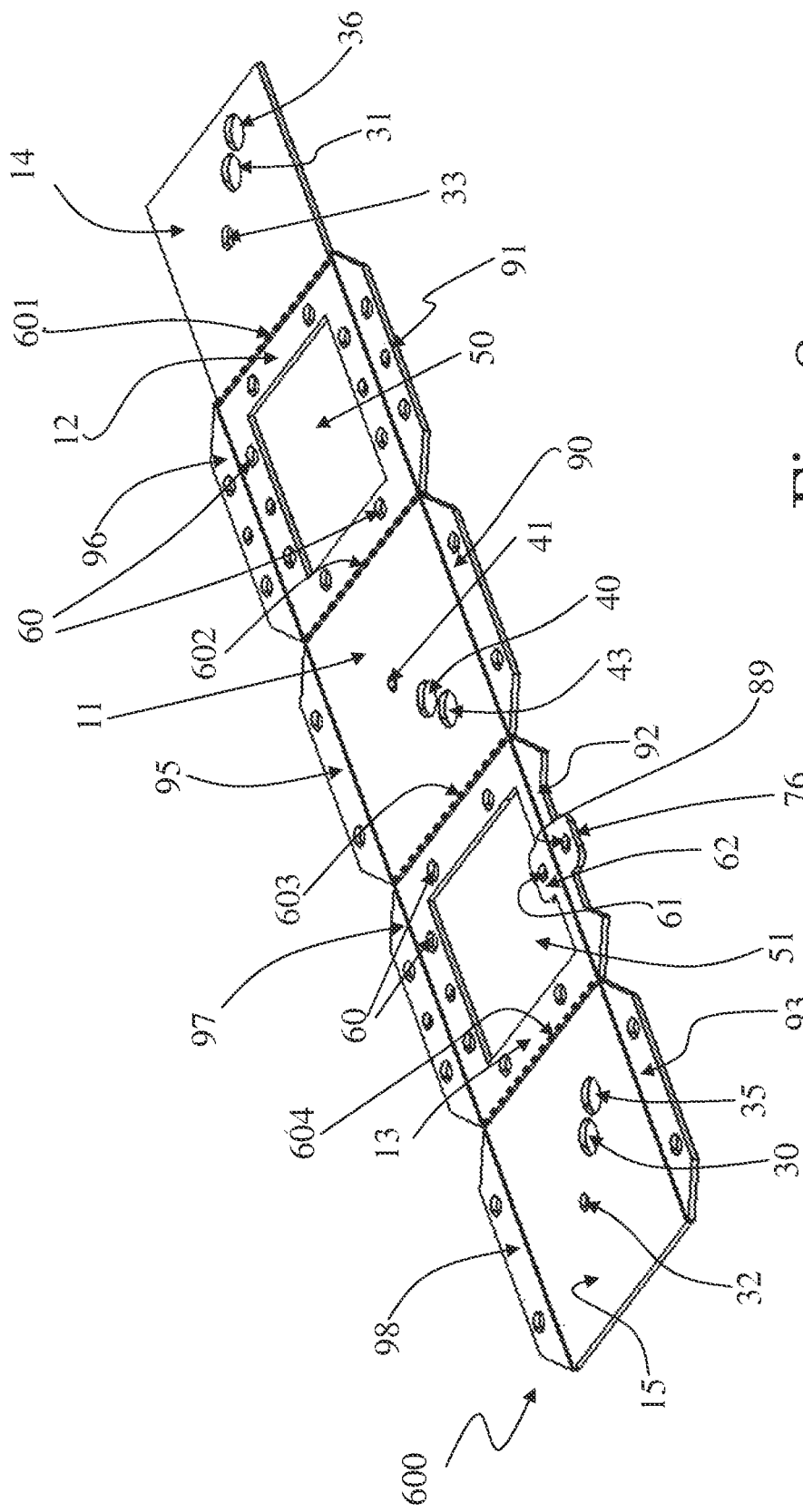
FIG. 8 shows a cut metal strip suitable to be folded so as to manufacture a base element suitable to be used in a cabinet according to an exemplary embodiment of the present disclosure.

The exemplary manufacturing process includes:

a) cutting a metal plate, for example, made of hot-galvanized steel sheet or alternatively made of pickled steel sheet (FIG. 8 illustrates, for example, a cut metal plate 600, or strip 600, suitable for being folded to realize a base element 10 according to the exemplary embodiment of FIGS. 5 and 7);

b) folding the cut metal plate 600 along a first folding line 601, a second folding line 602, a third folding line 603 and a fourth folding line 604 (shown schematically by dot lines in FIG. 8) which are parallel to each other, so as to define the lower wall 11, the two lateral walls 12 and 13 and the two upper walls 14 and 15 of the base element 10; and c) providing means for coupling the upper wall 14 and the upper wall 15 to each other.

For example, the upper corner portion 72 of the base element 10 is defined by folding the cut metal plate 600 along the first bending line 601, the lower corner portion 70 is defined by folding the cut metal plate 600 along the second bending line 602, the lower corner portion 71 is defined by folding the cut metal plate 600 along the third folding line 603, and the upper corner portion 73 is defined by folding the cut metal plate 600 along the fourth folding line 604.

According to an exemplary embodiment, the manufacturing process includes defining at least an indent 75 in at least one of the corner portions 70-73.

According to an exemplary embodiment, the upper wall 14 is defined by folding the cut metal plate along the folding line 601 so that, at the end of the process step b), such wall 14 extends from the upper end 20 of the lateral wall 12 to the lateral wall 13. The upper wall 15 is defined by folding the cut metal plate 600 along the fourth folding line 604 so that, at the end of the process step b), such wall 15 covers the upper wall 14 (e.g., it overlaps and rests on the upper wall 14).

According to an exemplary manufacturing solution, the process step b) includes: firstly folding the cut metal plate 600 along the first folding line 601 so as to define the upper wall 14; then folding the unfolded portion of the metal plate 600 along the second folding line 602 so as to define the lateral wall 12; then folding the unfolded portion along the third folding line 603 so as to define the lower wall 11; and, finally, folding the unfolded portion along the fourth folding line 604 so as to define the upper wall 15.

According to an exemplary embodiment, the process step c) includes defining in the cut metal plate 600 at least a first through hole 31, 33, 36 and a corresponding second through hole 30, 32, 35, in such a way that, at the end of the process step b), the first through hole 31, 33, 36 is defined in the upper wall 14 and the second through hole 30, 32, 35 is defined in the upper wall 15. For example, the second through hole 30, 32, 35 is placed over and aligned to the corresponding first through hole 31, 33, 36.

A fixing screw can be coupled to the aligned first and second through holes 31-30, 33-32 and 36-35 31 so as to mutually fix the upper walls 14, therefore avoiding the relative movement between such walls 14 and 15.

With reference to the example of cut metal plate 600 illustrated in FIG. 8, the process step c) includes defining the three through holes 31, 33, 36 and the three corresponding through holes 30, 32, 35 in the cut metal strip 600, in such a way that, at the end of the process step b), the through holes 31, 33, 36 are defined in the upper wall 14, and the through holes 30, 32, 35 are defined in the upper wall 15. For example, the through holes 30, 32 and 35 are placed over and aligned to the holes 31, 33 and 36, respectively, for the insertion of fixing screws.

According to an exemplary embodiment, the manufacturing process of the base element 10 according to the present disclosure includes defining in the cut plate 600 a first opening 50 and a second opening 51 which are suitable for defining, at the end of the process step b), the window 50 of the lateral wall 12 and the window 51 of the lateral wall 13, respectively.

According to an exemplary embodiment, the manufacturing process includes defining in the cut plate 600 means 40, 41, 43 for fixing the lower wall 11 of the manufactured base element 10 to the bearing surface 100.

With reference to the example of FIG. 8, the manufacturing process includes defining three through holes 40, 41 and 43 in the cut metal strip 600 so that, at the end of the step b), they are defined in the lower wall 11. A fixing screw can be inserted in each of the through holes 40, 41, 43 and coupled to the bearing surface 100.

With reference to the example illustrated in FIG. 8, the process step a) can include cutting the metal plate 600 so as it comprises the tab 91 connected to a corresponding portion 12 of the cut metal plate 600 that defines, at the end of the step b), the lateral wall 12, the tab 90 placed side by side to the tab 91 and connected to a corresponding portion 11 of the cut metal plate 600 that defines, at the end of the step b), the lower wall 11, the tab 92 placed side by side to the tab 90 and connected to a corresponding portion 13 of the cut metal plate 600 that defines, at the end of the step b), the lateral wall 13, and the tab 93 placed side by side to the tab 92 and connected to a corresponding portion 15 of the cut metal plate 600 that defines, at the end of the step b), the upper wall 15.

Further, the process step a) can include cutting the metal plate so that it includes the tab 96 connected to the portion 12 of the cut metal plate 600, so as to be opposed to the tab 91, the tab 95 placed side by side to the tab 96 and connected to the portion 11 of the cut metal plate 600, so as to be opposed to the tab 90, the tab 97 placed side by side to the tab 95 and connected to the portion 13 of the cut metal plate 600, so as to be opposed to the tab 92, and the tab 98 placed side by side to the tab 97 and connected to the portion 15 of the cut metal plate 600, so as to be opposed to the tab 93.

The manufacturing method includes folding each of the tabs 90-93 with respect to the corresponding portions 11, 12, 13 and 15 of the cut metal plate 600 so that, at the end of process step b), such tabs 90-93 are shaped and mutually connected as per the above description of the base element 10, and as per the exemplary embodiment of FIGS. 5 and 7.

In the same way, the manufacturing method includes folding each of the tabs 95-98 with respect to the corresponding portions 11, 12, 13 and 15 of the cut metal plate 600 so that, at the end of process step b), such tabs 95-98 are shaped and mutually connected as per the above description of the base element 10, and as per the exemplary embodiment of FIGS. 5 and 7.

According to an exemplary manufacturing solution, the folding operation of the tabs 90-03 and 95-98 is performed before starting the process step b).

According to an exemplary embodiment, the manufacturing process includes defining means 60, 61 in the cut metal plate 600, such as, for example, the through holes 60, 61, so that, the end of the process step b), the means 60, 61 are suitable for fixing one or more components or elements to the base element 10, for example, to the lateral walls 12 and 13.

For example, with reference to the exemplary embodiment illustrated in FIG. 8, the manufacturing process includes defining the tongue 62 and the respective through hole 61.

According to an exemplary embodiment, the manufacturing process includes defining means 88, 89 in the cut metal plate 600, such as, for example, the through holes 88, 89, so that, the end of the process step b), the means 88, 89 are suitable for fixing one or more components or elements to the base element 10, for example, to the tabs 90-93 and 95-98.

For example, with reference to the exemplary embodiment illustrated in FIG. 8, the manufacturing process includes defining the tongue 76 and the respective through hole 89.

Further, the present disclosure provides an electrical switchboard, such as, for example, a low voltage switchboard, which includes the cabinet 1000, wherein one or more electrical components of the switchboard itself are housed into the internal space defined by the frame 1 of the cabinet 1000 itself.

In practice, it has been seen how the exemplary cabinet 1000 according to the present disclosure achieves the intended object of offering improvements over known solutions.

For example, the sturdiness of the base element 10 and its capability to withstand the weight exerted by the frame 1 (and, when present, by the components associated with or housed into the internal space of such frame 1) is improved by having the two upper walls 14 and 15 placed, at least partially, one over the other and mutually coupled. For example, the lateral walls 12, 13 cannot be displaced from their operative supporting position, because the respective upper walls 14 and 15 are coupled each other (so as a relative movement between such walls 14 and 15 is avoided, or at least limited).

The indents 75 at the corner portions 70-73 of the base element 10 and/or the disclosed connection between the tabs 90-93 and 95-98 can further improve the sturdiness of the base element 10 and its capability of withstanding the weight.

The disclosed windows 50, 51 300, 301 provide access for an operator to the internal part of the base element 10 from all the four sides of such element 10. For example, each of such windows 50, 51, 300 and 301 provides access to the internal surfaces of the lower wall 11 and the upper wall 14, for performing the fixing operation of the base element 10 to bearing surface 100 and to the frame 1.

The fixation operation of the base element 10 to the bearing surface 100 can be further improved by using the disclosed shaped body 200, since such fixing operation can be easily performed on the flat surface 201 of the shaped body 200, without accessing the interior part of the base element 10.

Moreover, all parts/components can be replaced with other technically equivalent elements; in practice, the type of materials, and the dimensions, can be any according to needs and to the state of the art.

For example, alternatively to the use of through holes and fixing screw, the coupling between the upper walls 14 and 15 could be performed by a mechanical matching between one or more parts of such walls 14, 15, or by other coupling means suitable for avoiding a relative movement between such walls 14, 15.

For example, an overall base element of the supporting base 2 could be realized by stacking to each other a plurality of base elements 10. According to an exemplary embodiment, such overall base element would include a first, lower, base element 10 and a second, upper, base element 10 which is stacked on the first base element 10.

The lower wall 11 of the upper base element 10 rests on the coupled upper walls 14, 15 of the lower base element 10. For example, the lower wall 11 of the upper base element 10 is also fixed to the coupled walls 14, 15 of the lower base element 10, for example, using the through hole 40 of the upper base element 10 and the pair of through holes 30-31 of the lower base element 10.

An additional fixing point between the upper and lower base element 10 could be provided by the through hole 41 of the upper base element 10 and the pair of through holes 32-33 of the lower base element 10.

By having at least two fixing points between the upper and lower base elements 10, a relative rotation between such base elements 10 is avoided, or at least reduced.

For example, even if in the exemplary embodiment of FIGS. 5 and 7 the tabs 90-93 and the tabs 95-98 are provided at first and second opposite lateral faces of the base element 10, such base element 10 could include only the tabs 90-93 at the first lateral face, or only the tabs 95-98 at the second lateral face.

Further, the shape of the tabs could be different with respect to the exemplary embodiment of FIGS. 5 and 7, but suitable for providing a connection between the tabs 90-93 and 95-98 such that the upper tabs 93 and 98 abuts against the respective lateral tabs 91-92, 96, 97, which in turn abut against the respective lower tabs 90 and 95.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cabinet for an electrical switchboard, comprising:
a supporting base; and
a frame mounted on the supporting base,
wherein the supporting base comprises a base element which includes:
a lower wall configured to rest on a bearing surface;
a first lateral wall and a second lateral wall which protrude transversally from the lower wall and face each other;
a first upper wall protruding from an upper end of the first lateral wall towards the second lateral wall;
a second upper wall protruding from an upper end of the second lateral wall towards the first lateral wall, so as to extend over a portion of the first upper wall; and
coupling means which couple the first and second upper walls to each other for supporting a corresponding portion of the frame.

2. The cabinet according to claim 1, wherein the coupling means comprise:
a first through hole and a second through hole defined in the first upper wall and in the second upper wall, respectively, the second through hole being placed over and aligned to the first though hole; and
a fixing screw coupled to the first and second through holes.

3. The cabinet according to claim 2, wherein the fixing screw is also coupled to the corresponding portion of the frame.

4. The cabinet according to claim 1, comprising:
a first window defined in at least one of the first and second lateral walls, so as to provide access to an internal part of the base element.

5. The cabinet according to claim 4, wherein:
the lower wall, the first lateral wall, the second lateral wall, and the second upper wall have a first side, a second side, a third side and a fourth side, respectively, which delimit a face of the base element perpendicular with respect to the lower wall and with respect to the first and second lateral walls;
the base element comprises,
a first tab protruding from the first side towards the second upper wall,
a second tab protruding from the second side towards the second lateral wall,
a third tab protruding from the third side towards the first lateral wall, and
a fourth tab protruding from the fourth side towards the lower wall;
the first, second, third and fourth tabs are shaped so that the fourth tab abuts against the second and third tabs, and the second and third tabs in turn abut against the first tab;
the supporting base comprises a shaped body operatively associated with the base element and including:
a substantially flat portion configured to rest on the bearing surface,
means defined on the flat portion for fixing the shaped body to the bearing surface, and
a connecting portion connected to a corresponding portion of the base element;
the connecting portion comprises a first hooking element and a second hooking element protruding transversally from the flat portion, so that the first hooking element is hooked to the first tab, and the second hooking element is hooked to an edge of the first window.

6. An electrical switchboard comprising a cabinet according to claim 5.

7. The cabinet according to claim 1, wherein at least one of the first and second lateral walls comprises means for fixing at least one of an element and component to the base element.

8. The cabinet according to claim 1, comprising:
a first corner portion defined by the lower wall and the first lateral wall;
a second corner portion defined by the lower wall and the second lateral wall;
a third corner portion defined by the first lateral wall and the first upper wall; and
a fourth corner portion defined by the second lateral wall and the second upper wall,
wherein at least one of the first, second, third and fourth corner portions comprises an indent.

9. The cabinet according to claim 1, wherein:
the lower wall, the first lateral wall, the second lateral wall, and the second upper wall have a first side, a second side, a third side and a fourth side, respectively, which delimit a face of the base element perpendicular with respect to the lower wall and with respect to the first and second lateral walls;
the base element comprises
a first tab protruding from the first side towards the second upper wall,
a second tab protruding from the second side towards the second lateral wall,
a third tab protruding from the third side towards the first lateral wall; and
a fourth tab protruding from the fourth side towards the lower wall; and
the first, second, third and fourth tabs are shaped so that the fourth tab abuts against the second and third tabs, and the second and third tabs in turn abut against the first tab.

10. The cabinet according to claim 9, wherein the first, second, third and fourth tabs are shaped to delimit a second window for providing access to an internal part of the base element.

11. The cabinet according to claim 9, wherein the first tab has first and second opposed oblique sides, the second tab has third and fourth opposed oblique sides, the third tab has fifth and sixth opposed oblique sides, and the fourth tab has seventh and eighth opposed oblique sides, and
wherein the seventh and eight oblique sides abut against the fourth and sixth oblique sides, respectively, and the third and fifth oblique sides abut against the first and second oblique sides respectively.

12. The cabinet according to claim 9, wherein at least one of the first, second, third and fourth tabs comprises means for fixing at least one of a component and an element to the base element.

13. The cabinet according to claim 1, wherein the supporting base comprises a shaped body operatively associated with the base element and comprising:
a substantially flat portion configured to rest on the bearing surface;
means defined on the flat portion for fixing the shaped body to the bearing surface; and
a connecting portion connected to a corresponding portion of the base element.

14. The cabinet according to claim 1, wherein the base element comprises a first base element and a second base element stacked on the first base element, and
  wherein the lower wall of the second base element rests on the coupled first and second upper walls of the first base element.

15. An electrical switchboard comprising a cabinet according to claim 1.

* * * * *